US008111380B2

(12) United States Patent
Abrams et al.

(10) Patent No.: US 8,111,380 B2
(45) Date of Patent: Feb. 7, 2012

(54) WRITE-PATTERN DETERMINATION FOR MASKLESS LITHOGRAPHY

(75) Inventors: Daniel S. Abrams, Palo Alto, CA (US); Timothy Lin, San Jose, CA (US)

(73) Assignee: Luminescent Technologies, Inc., Palo Alto, CA (US)

(*) Notice: Subject to any disclaimer, the term of this patent is extended or adjusted under 35 U.S.C. 154(b) by 360 days.

(21) Appl. No.: 12/206,660

(22) Filed: Sep. 8, 2008

(65) Prior Publication Data

US 2009/0073413 A1 Mar. 19, 2009

Related U.S. Application Data

(60) Provisional application No. 60/972,676, filed on Sep. 14, 2007.

(51) Int. Cl.
*G03B 27/54* (2006.01)
*G03B 27/44* (2006.01)
*G03B 27/32* (2006.01)
*G03B 27/68* (2006.01)
*G03B 27/42* (2006.01)

(52) U.S. Cl. ............... 355/67; 355/46; 355/52; 355/53; 355/77

(58) Field of Classification Search .............. 355/52, 355/53, 55, 67–71, 77, 40, 46, 75; 716/21, 716/55, 30, 54; 250/492.1, 492.2, 492.22, 250/493.1; 430/5, 30, 311, 394
See application file for complete search history.

(56) References Cited

U.S. PATENT DOCUMENTS

| | | | | |
|---|---|---|---|---|
| 5,315,700 A | * | 5/1994 | Johnston et al. | 345/502 |
| 5,488,418 A | * | 1/1996 | Mishima et al. | 375/240.11 |
| 5,710,561 A | * | 1/1998 | Schmidt et al. | 341/63 |
| 6,261,728 B1 | * | 7/2001 | Lin | 430/30 |
| 6,285,488 B1 | * | 9/2001 | Sandstrom | 359/290 |
| 6,428,940 B1 | * | 8/2002 | Sandstrom | 430/22 |
| 6,438,199 B1 | * | 8/2002 | Schultz et al. | 378/34 |
| 6,504,644 B1 | * | 1/2003 | Sandstrom | 359/291 |
| 7,618,751 B2 | | 11/2009 | Sandstrom et al. | |
| 7,698,665 B2 | | 4/2010 | Abrams et al. | |
| 7,703,049 B2 | | 4/2010 | Abrams et al. | |
| 7,707,541 B2 | | 4/2010 | Abrams et al. | |
| 7,805,700 B2 | | 9/2010 | Peng | |
| 2002/0171816 A1 | * | 11/2002 | Markle | 355/67 |
| 2003/0061587 A1 | * | 3/2003 | Zhang et al. | 716/11 |

(Continued)

OTHER PUBLICATIONS

Abrams, D.S., "Write-Pattern Determination for Maskless Lithography," U.S. Appl. No. 12/206,651, filed Sep. 8, 2008, Office Action mailed Mar. 4, 2011.

(Continued)

*Primary Examiner* — Peter B Kim
*Assistant Examiner* — Christina Riddle
(74) *Attorney, Agent, or Firm* — Wilson Sonsini Goodrich & Rosati

(57) ABSTRACT

A method for generating a write pattern to be used in a maskless-lithography process is described. During the method, a computer system determines a one-to-one correspondence between pixels in the write pattern and at least a subset of elements in a spatial-light modulator used in the maskless-lithography process. Furthermore, the computer system generates the write pattern. Note that the write pattern includes features corresponding to at least the subset of elements in the spatial-light modulator, and the generating is in accordance with a characteristic dimension of an element in the spatial-light modulator and a target pattern that is to be printed on a semiconductor wafer during the maskless-lithography process.

33 Claims, 8 Drawing Sheets

U.S. PATENT DOCUMENTS

| | | | |
|---|---|---|---|
| 2003/0123040 A1* | 7/2003 | Almogy | 355/69 |
| 2003/0184809 A1* | 10/2003 | Clouthier et al. | 358/3.01 |
| 2004/0075882 A1* | 4/2004 | Meisburger | 359/290 |
| 2004/0130561 A1* | 7/2004 | Jain | 345/694 |
| 2005/0068613 A1* | 3/2005 | McGeoch | 359/350 |
| 2006/0033902 A1* | 2/2006 | Latypov et al. | 355/67 |
| 2006/0087635 A1* | 4/2006 | Kazumi et al. | 355/69 |
| 2006/0098181 A1* | 5/2006 | Case et al. | 355/67 |
| 2006/0269116 A1* | 11/2006 | Makarovic et al. | 382/141 |
| 2007/0045572 A1* | 3/2007 | Kessels et al. | 250/492.22 |
| 2007/0198963 A1 | 8/2007 | Granik et al. | |
| 2009/0077526 A1 | 3/2009 | Abrams et al. | |
| 2009/0077527 A1* | 3/2009 | Gergov et al. | 716/21 |

OTHER PUBLICATIONS

Abrams, D.S., "Write-Pattern Determination for Maskless Lithography," U.S. Appl. No. 12/206,651, filed Sep. 8, 2008, Response filed Jul. 29, 2011.

Abrams, D. S., et al., "Write Pattern Determination for Maskless Lithography," U.S. Appl. No. 12/206,651, filed Sep. 8, 2008, Office Action mailed Mar. 4, 2011.

Abrams, D. S., et al., "Write Pattern Determination for Maskless Lithography," U.S. Appl. No. 12/206,651, filed Sep. 8, 2008, Response to Office Action filed Jul. 29, 2011.

* cited by examiner

┌─────────────────────────────────────────────────────────┐
│ DETERMINE A ONE-TO-ONE CORRESPONDENCE BETWEEN PIXELS IN A WRITE │
│ PATTERN AND AT LEAST A SUBSET OF ELEMENTS IN A SPATIAL-LIGHT    │
│ MODULATOR USED IN A MASKLESS LITHOGRAPHY PROCESS               │
│ <u>510</u>                                                     │
└─────────────────────────────────────────────────────────┘
                              │
                              ▼
┌─────────────────────────────────────────────────────────┐
│ GENERATE THE WRITE PATTERN, WHERE THE WRITE PATTERN INCLUDES │
│ FEATURES CORRESPONDING TO AT LEAST THE SUBSET OF ELEMENTS IN THE │
│ SPATIAL-LIGHT MODULATOR, AND WHERE THE WRITE PATTERN IS │
│ GENERATED BASED ON A CHARACTERISTIC DIMENSION OF AN ELEMENT AND │
│ A TARGET PATTERN TO BE PRINTED ON A SEMICONDUCTOR WAFER DURING │
│ THE MASKLESS-LITHOGRAPHY PROCESS. │
│ <u>512</u> │
└─────────────────────────────────────────────────────────┘

ADJUST A DYNAMIC SOURCE TO PROVIDE AN ILLUMINATION PATTERN, WHERE THE DYNAMIC SOURCE IS ELECTRONICALLY CONFIGURABLE
610

↓

CONFIGURE A FIRST SPATIAL-LIGHT MODULATOR TO PROVIDE AN IMAGE PATTERN BY MODIFYING THE ILLUMINATION PATTERN, WHERE MODIFICATION OF THE ILLUMINATION PATTERN IS BASED ON A WRITE PATTERN THAT SPECIFIES SETTINGS OF ELEMENTS IN THE FIRST SPATIAL-LIGHT MODULATOR FOR AT LEAST AN EXPOSURE OF AT LEAST A PORTION OF A SEMICONDUCTOR WAFER DURING A MASKLESS LITHOGRAPHY PROCESS
612

WRITE-PATTERN DETERMINATION FOR MASKLESS LITHOGRAPHY

CROSS-REFERENCE

This application claims the benefit of U.S. Provisional Application No. 60/972,676, filed Sep. 14, 2007, which application is incorporated herein by reference.

This application is related to copending patent application Ser. No. 12/206,651 filed Sep. 8, 2008 for Write-Pattern Determination for Maskless Lithography, invented by Daniel S. Abrams and Timothy Lin.

BACKGROUND

1. Field of the Invention

The present invention relates to techniques for determining write patterns for maskless-lithography processes that use write devices.

2. Related Art

Lithography processing represents an essential technology for manufacturing Integrated Circuits (IC) and Micro Electro-Mechanical Systems (MEMS). Lithographic techniques are used to define patterns, geometries, features, shapes, etc. (henceforth referred to as 'patterns') onto an integrated-circuit die, semiconductor wafer, or chips, where the patterns are typically defined by a set of contours, lines, boundaries, edges, curves, etc. (henceforth referred to as 'contours'), which generally surround, enclose, and/or define the boundary of the various regions which constitute the patterns.

Existing lithographic techniques include photolithography, in which images defined by photo-masks are printed onto the integrated-circuit dies or the semiconductor wafers. Unfortunately, it is increasingly difficult to design and manufacture photo-masks. In particular, demand for increased density of features on these dies and wafers has resulted in the design of circuits with decreasing minimum dimensions. However, due to the wave nature of light, as dimensions approach sizes comparable to the wavelength of the light used in the photolithography process, the resulting wafer patterns deviate from the corresponding photo-mask patterns and are accompanied by unwanted distortions and artifacts.

Furthermore, the design and manufacture of photo-masks is time consuming and expensive. This poses a significant challenge during integrated-circuit development and for the production of small quantities of integrated-circuit dies or the semiconductor wafers.

In principle, maskless lithography offers a solution to at least some of these problems. In this technique, a write device directly prints a write pattern onto the integrated-circuit dies or the semiconductor wafers, thereby eliminating the need for photo-masks.

For example, researchers are investigating the use of spatial-light modulators, such as arrays of adjustable mirrors, in write devices. These spatial-light modulators may be configured to define the write pattern on at least a portion of the integrated-circuit dies or the semiconductor wafers. Unfortunately, existing techniques first determine mask patterns, which are then converted into write patterns. This is cumbersome and often ignores characteristics of the spatial-light modulators when the mask patterns are determined. Furthermore, the bifurcated-design technique may make it more difficult to improve resolution and/or a process window in a lithography process by appropriately pre-distorting the write pattern (using techniques such as Optical Proximity Correction or OPC) such that the wafer pattern is printed more accurately.

Hence, what is needed is a method and an apparatus that facilitates determination of write patterns without the above-described problems.

SUMMARY

One embodiment of the present invention provides a method for generating a write pattern to be used in a maskless-lithography process. During the method, a computer system determines a one-to-one correspondence between pixels in the write pattern and at least a subset of elements in a spatial-light modulator used in the maskless-lithography process. Furthermore, the computer system generates the write pattern. Note that the write pattern includes features corresponding to at least the subset of elements in the spatial-light modulator, and the generating is in accordance with a characteristic dimension of an element in the spatial-light modulator and a target pattern that is to be printed on a semiconductor wafer during the maskless-lithography process.

In some embodiments, the spatial-light modulator includes a grid of elements, and the elements are mirrors.

In some embodiments, the spatial-light modulator modifies a magnitude and/or a phase of an illumination beam (such as light) during the maskless-lithography process.

In some embodiments, at least one of the features includes only one pixel and/or at least the subset of elements includes only one element.

In some embodiments, the write pattern includes information specifying settings or a configuration of the elements to print a printed pattern corresponding to the features on the semiconductor wafer during the maskless-lithography process.

In some embodiments, the write pattern is to be reduced by a pre-determined demagnification during the maskless-lithography process.

In some embodiments, the generating includes image-based optical proximity correction in which a forward model is used to estimate a printed pattern to be printed on a semiconductor wafer during the maskless-lithography process. However, in some embodiments the generating includes an inverse-lithography calculation in which an inverse calculation is used to estimate the write pattern based on the target pattern. Note that the target pattern may include a format that is compatible with GDSII or OASIS.

In some embodiments, the write pattern corresponds to a complex transmission function and/or a complex reflectivity function that represent a static or dynamic configuration of the elements of the spatial-light modulator.

In some embodiments, the write pattern includes a binary pattern and/or a continuous-tone pattern.

In some embodiments, the generating includes calculating a gradient of another function. Note that the other function depends on the write pattern and an estimate of the printed pattern to be printed on the semiconductor wafer during the maskless-lithography process. Furthermore, the gradient is calculated based on a formula obtained by taking the derivative of the other function.

Another embodiment provides a computer system configured to execute instructions corresponding to at least some of the above-described operations.

Another embodiment provides a computer-program product for use in conjunction with the computer system.

Another embodiment provides a semiconductor wafer. This semiconductor wafer is produced in the maskless-lithography process that uses the write pattern.

Another embodiment provides a data file stored in a computer-readable memory that includes information corresponding to the write pattern.

Another embodiment of the present invention provides an apparatus to print the target pattern on the semiconductor wafer during the maskless-lithography process. This apparatus includes a dynamic source configured to provide an illumination pattern and a first spatial-light modulator configured to modify the illumination pattern. Note that the dynamic source may be electronically configurable. Furthermore, the modification of the illumination pattern is to be based on a write pattern that specifies settings of elements in the first spatial-light modulator for at least an exposure of at least a portion of the semiconductor wafer during the maskless-lithography process.

In some embodiments, the dynamic source includes a second spatial-light modulator.

In some embodiments, settings of the dynamic source and the first spatial-light modulator are selected based on the target pattern.

In some embodiments, the target pattern includes a format that is compatible with GDSII or OASIS.

In some embodiments, the dynamic source enables adjustment of a size and/or shape of an aperture.

In some embodiments, the maskless-lithography process includes multiple exposures. Note that the dynamic source and/or the first spatial-light modulator may be adjusted between at least two of the multiple exposures.

In some embodiments, the elements in the first spatial-light modulator are arranged in a grid. For example, the elements may be mirrors.

In some embodiments, the first spatial-light modulator modifies a magnitude and/or a phase of the illumination pattern during the maskless-lithography process to produce an image pattern.

In some embodiments, the write pattern includes a binary pattern and/or a continuous-tone pattern.

Another embodiment provides a method for providing the image pattern during a maskless-lithography process. During the method, a direct-write apparatus adjusts the dynamic source to provide the illumination pattern and configures the first spatial-light modulator to provide the image pattern by modifying the illumination pattern. Note that the dynamic source may be electronically configurable. Furthermore, modification of the illumination pattern is based on the write pattern.

Another embodiment of the present invention provides a method for providing a write pattern to a device that is to print the target pattern on the semiconductor wafer during the maskless-lithography process. During the method, a compressed write pattern is received by the device. Then, the device decodes the compressed write pattern to produce the write pattern, and adjusts a spatial-light modulator in the device based on the write pattern. Note that the write pattern specifies settings of elements in the spatial-light modulator for at least an exposure of at least the portion of the semiconductor wafer during the maskless-lithography process.

In some embodiments, the target pattern includes a format that is compatible with GDSII or OASIS.

In some embodiments, the compressed write pattern is received to the device and the decoding occurs concurrently, thereby enabling dynamic adjustment of the spatial-light modulator during the maskless-lithography process.

In some embodiments, the elements in the spatial-light modulator are arranged in a grid. For example, the elements may be mirrors.

In some embodiments, the spatial-light modulator modifies a magnitude and/or a phase of an illumination beam during the maskless-lithography process.

In some embodiments, the maskless-lithography process includes multiple exposures. Furthermore, the spatial-light modulator is adjusted between at least two of the multiple exposures.

In some embodiments, the write pattern includes a binary pattern and is compressed using a run-length encoding technique. Furthermore, for each linear array of pixels in the write pattern, the run-length encoding technique may provide at least one data sequence, which may include: a first number of consecutive first type of pixels in the write pattern; a first grayscale value for a first transition pixel; a second number of consecutive second type of pixels in the write pattern; a second grayscale value for a second transition pixel; and a third number of consecutive first type of pixels in the write pattern. For example, the first type of pixels may correspond to a binary '1' in the write pattern and the second type of pixels may correspond to a binary '0' in the write pattern. Alternatively, the first type of pixels may correspond to a binary '0' in the write pattern and the second type of pixels may correspond to a binary '1' in the write pattern. Note that the linear array may correspond to a row and/or a column in the write pattern.

In some embodiments, the write pattern includes a continuous-tone pattern and is compressed using a lossless compression technique. For example, the lossless compression technique may include a Joint Photographic Experts Group (JPEG) compression technique.

Another embodiment provides an apparatus to print the target pattern on the semiconductor wafer during the maskless-lithography process. This apparatus includes the spatial-light modulator configured to modify the illumination beam, and the modification of the illumination beam is to be based on the write pattern. Furthermore, the apparatus is configured to receive the compressed write pattern and to decode the compressed write pattern to produce the write pattern.

Another embodiment provides a data structure stored in a computer-readable memory. This data structure includes the compressed write pattern.

BRIEF DESCRIPTION OF THE FIGURES

FIG. 5 is a flow chart illustrating a process for determining a write pattern in accordance with an embodiment of the present invention.

FIG. 6 is a flow chart illustrating a process for providing an image pattern in accordance with an embodiment of the present invention.

FIG. 8 is a block diagram illustrating a data structure in accordance with an embodiment of the present invention.

Note that like reference numerals refer to corresponding parts throughout the drawings.

DETAILED DESCRIPTION

Figure 1:
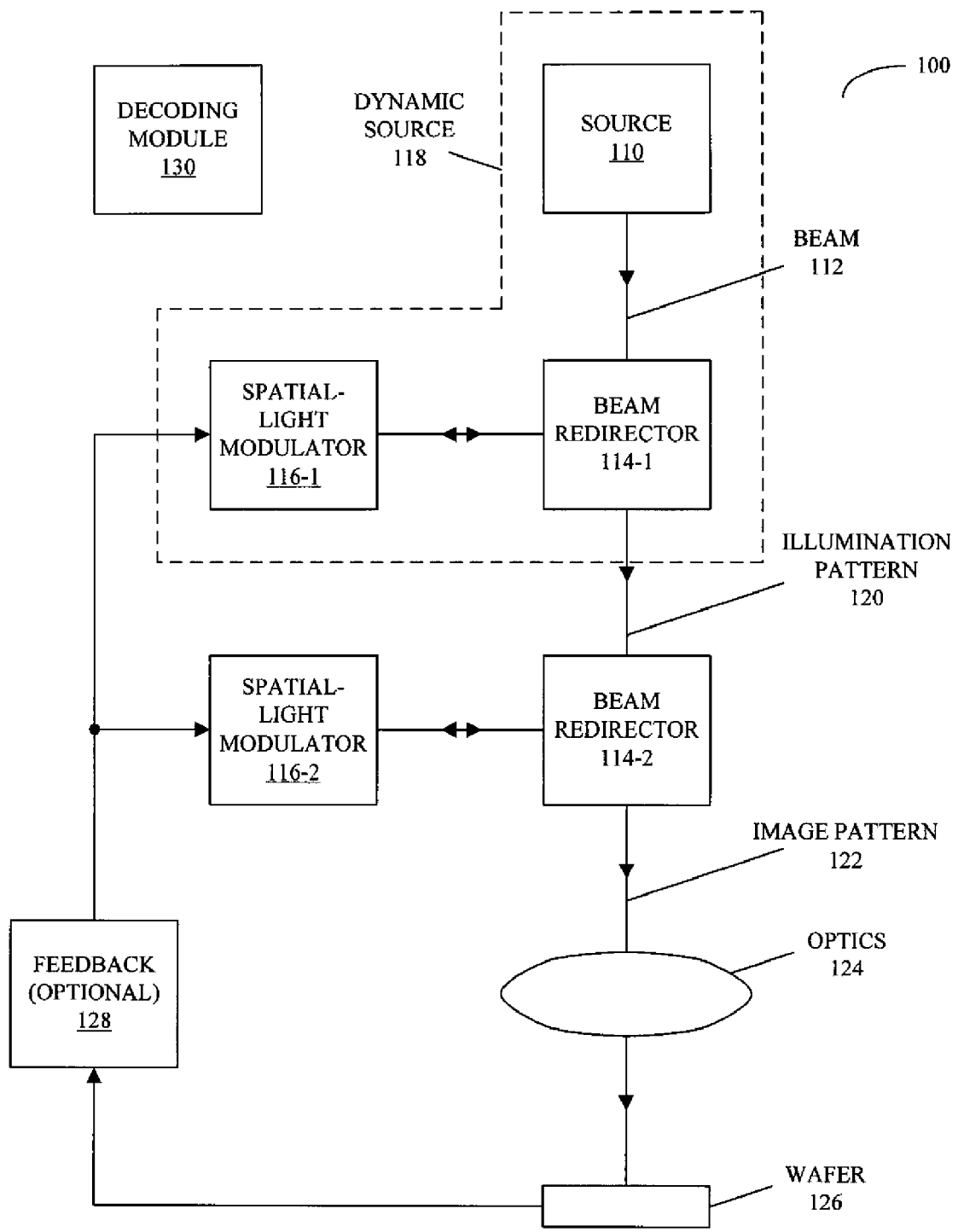
FIG. 1 is a block diagram illustrating a write device in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a write device, a computer system, a method, and a computer program product (i.e., software), and data structures or files for use with the write device and/or computer system are described. These systems, processes, and data structures may be used to determine write patterns that, in turn, may be used when producing integrated-circuit dies and/or semiconductor wafers (henceforth referred to as semiconductor wafers). In particular, the write device may modify or modulate an illumination beam (such as an optical beam or an electron beam) based on the write pattern, thereby defining patterns on one or more wafers during at least a portion of a maskless-lithography process and/or a semiconductor-manufacturing process (henceforth referred to as a maskless-lithography process). Furthermore, the patterns defined on semiconductor wafers may correspond to target patterns.

In some embodiments, a computer system determines a one-to-one correspondence between pixels in the write pattern and at least a subset of elements in a spatial-light modulator (such as mirrors) used in the maskless-lithography process. For example, the write pattern may be determined using an inverse-lithography calculation in which an inverse calculation is used to estimate the write pattern based on the target pattern. In particular, the write pattern may be determined based on differences between the target pattern and an estimate of the printed wafer pattern. Furthermore, the write pattern may be determined based on a characteristic dimension of an element in the spatial-light modulator and/or a pixel, such as a size, shape, and/or border. In some embodiments, a relative size (i.e., a dimensionless calculation) is used when the write pattern is determined, and the write pattern is subsequently scaled by an appropriate length scale (such as that of an element).

In some embodiments, the write device to print the target pattern includes a dynamic source configured to provide an illumination pattern and a spatial-light modulator configured to modify the illumination pattern and provide an image pattern. This dynamic source may be electronically configurable, and settings of elements in the spatial-light modulator may be based on the write pattern. Furthermore, the dynamic source and/or the spatial-light modulator may be configured to be adjusted between at least two exposures during the semiconductor-manufacturing process.

In some embodiments, the write device may be configured to receive a compressed write pattern, which is to be decoded and used to set a configuration of the spatial-light modulator. In this context, the write device may be defined generally to include one or more components that are coupled to the spatial-light modulator via a high bandwidth link (such as a data bus), and the compressed write pattern may be received via a lower bandwidth link. Note that receiving and decoding may occur concurrently. Furthermore, by reducing the amount of data transmitted to the write device, this technique may reduce data communication and decoding time, thereby enabling dynamic adjustment of the spatial-light modulator during the maskless-lithography process.

We now describe embodiments of the write device. FIG. 1 presents a block diagram illustrating a write device 100 in accordance with an embodiment of the present invention. This device may be used to print a target pattern on a semiconductor wafer during a maskless-lithography process. Write device 100 includes a source 110 that is configured to provide an illumination beam 112. In some embodiments, the illumination beam 112 is directed by a beam redirector 114-1 (which may include a beam splitter) to a spatial-light modulator 116-1. This modulator may modify a shape and/or a size of the illumination beam 112 to produce an illumination pattern 120. In some embodiments, the spatial-light modulator 116-1 may provide a dynamic aperture (i.e., an adjustable aperture, such as an electronic aperture) in the write device 100. In other embodiments a dynamic aperture is placed at a focal plane of collimating optics in the write device 100. Note that an aperture may be used to modify the cone angle of a bundle of rays that come to a focus in an image plane in the write device 100.

Note that the combination of source 110, beam redirector 114-1, and spatial-light modulator 116-1 may comprise as a dynamic source 118. In some embodiments, the dynamic source 118 includes additional optical components that are not shown. The dynamic source 118 may be electronically configurable, for example, in less than 100 ms or 1 s. For example, settings of elements in the spatial-light modulator 116-1 may be configured based on a Fourier-space pattern. This Fourier-space pattern may specify settings of these elements for at least an exposure of at least a portion of a semiconductor wafer 126 during a maskless- or electron-beam lithography process.

In example embodiments, the source 110 includes one or more lamps (including I line, g line, a wavelength of 193 nm, a wavelength of 248 nm, immersion, and/or any other optical lithography wavelength in air, water, or another fluid or gas) and/or a laser (in which case the write device 100 may be a laser writer). Note that in some embodiments the source 110 includes an electron-beam source. Furthermore, the source 110 and/or the dynamic source 118 may be configured to provide off-axis illumination, dipole illumination, quadrupole illumination, quasar illumination, incoherent illumination, coherent illumination, and/or any arbitrary illumination pattern 120.

After passing back through the beam redirector 114-1, the illumination pattern 120 may be directed to another spatial-light modulator 116-2 by another beam redirector 114-2. Note that additional optical components (not shown) may be included between the beam redirectors 114. This modulator may be configured, based on a write pattern, to modify the illumination pattern 120 to produce an image pattern 122. In particular, the write pattern may specify settings of elements in the spatial-light modulator 116-2 for at least an exposure of at least a portion of the semiconductor wafer 126 during the maskless- or electron-beam lithography process. This wafer may be exposed to the image pattern 122 after it passes back through the beam redirector 114-2 and may be de-magnified using optics 124. In an example embodiment, the demagnification is by a factor of 100 or more, or by a factor of 400 or more. In some embodiments, the printed wafer pattern is subsequently developed, for example, via processing of a photo-resist layer on a surface of the semiconductor wafer 126.

Configurations of one or both of the spatial-light modulators 116 may be selected based on the target pattern. For example, as described further below, the write pattern may be at least in part determined based on the target pattern. In addition, the Fourier-space pattern may be at least in part determined based on the target pattern. This target pattern may represent a layer in an integrated circuit. For example, the target pattern may be represented by a data format that is compatible with a polygon-type format. Therefore, in some embodiments the target pattern may be represented by a data format such as GDSII or OASIS. Furthermore, in some embodiments, the target pattern, the Fourier-space pattern, and/or the write pattern may include a pixel-based format (i.e., spatially discrete) data patterns, such as bitmap and/or grayscale images. Note that the write pattern may include a binary pattern and/or a continuous-tone pattern.

In some embodiments, the maskless-lithography process includes multiple exposures of the wafer 126. During this process, the illumination pattern 120 provided by the spatial-light modulator 116-1 and/or the image pattern 122 provided by the spatial-light modulator 116-2 may be adjusted between at least two of the multiple exposures. Furthermore, note that spatial-light modulators 116-1 may modify a magnitude and/or a phase of the illumination beam 112 and/or spatial-light modulators 116-2 may modify a magnitude and/or a phase of the illumination pattern 120.

In some embodiments, configurations of the dynamic source 118 (for example, of the spatial-light modulator 116-1) and/or the spatial-light modulator 116-2 are determined using an electronic wafer that is positioned at an image plane in the write device 100 (for example, at the position of the semiconductor wafer 126). In an example embodiment, the electronic wafer includes one or more CMOS or CCD optical sensors, and the configurations may be based on the determined images. Therefore, in some embodiments, settings of either or both of the spatial-light modulators 116 are adjusted using optional feedback 128. This feedback may be static (i.e., performed once), periodic (performed after a time interval), and/or dynamic (for example, adjusted during and/or between exposures in the maskless-lithography process).

Note that in some embodiments the write device 100 may include fewer or additional components, two or more components may be combined into a single component, and/or a position of one or more components may be changed.

Figures 2A, 2B:
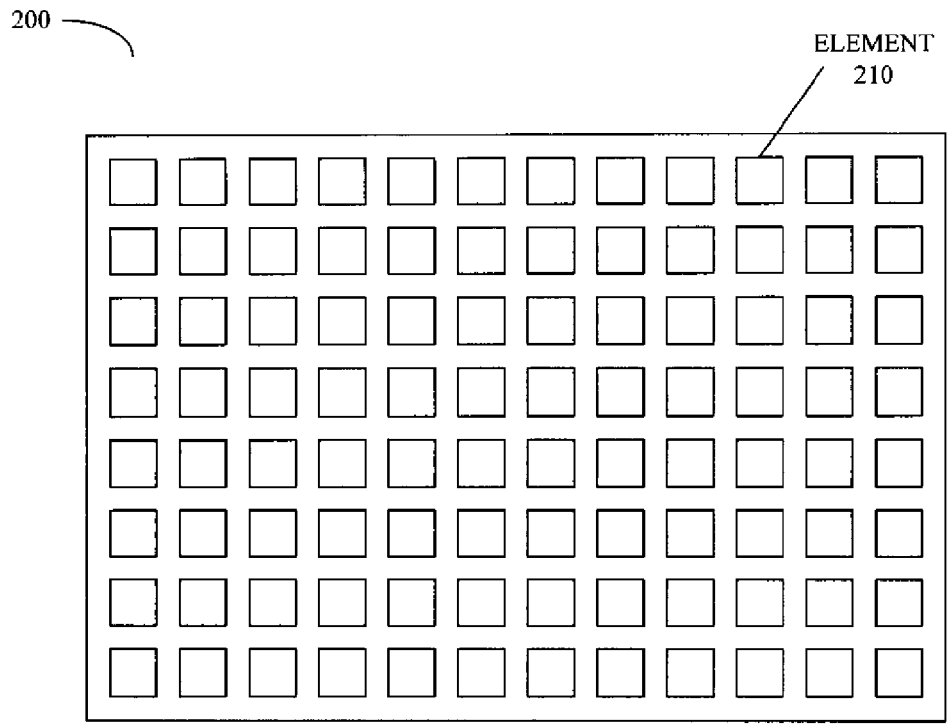
FIG. 2A is a block diagram illustrating a spatial-light modulator in accordance with an embodiment of the present invention.
FIG. 2B is a block diagram illustrating a compressed write pattern in accordance with an embodiment of the present invention.

FIG. 2A presents a block diagram illustrating a spatial-light modulator 200 (such as either or both of the spatial-light modulators 116 in FIG. 1) in accordance with an embodiment of the present invention. This modulator may include an array of elements, such as element 210, which may be arranged in a 2-dimensional grid (which may include 1024×1024 elements). In an example embodiment, these elements may be mirrors (such as in a deformable mirror device) that each have an area on the order of 1 $\mu m^2$ and are positioned to modify the illumination pattern 120 (FIG. 1), for example, by changing the magnitude of reflected light. Furthermore, in some embodiments multiple arrays of mirrors may be used, and the resulting image patterns 122 (FIG. 1) may be scanned over the semiconductor wafer 126 (FIG. 1). (Note that these mirrors may be manufactured using a MEMS-manufacturing process.) More generally, spatial-light modulator 200 may provide a complex-transmission function and/or a complex-reflectivity function associated with a static or dynamic configuration of the spatial-light modulator.

In some embodiments, the write pattern(s) may be provided to the write device 100 (FIG. 1) during the maskless-lithography process. For example, the write patterns may be transmitted to the write device by a computer system, which may be proximate to or remotely located with respect to the write device 100 (FIG. 1). However, depending on the size of the array in the spatial-light modulator 200 (i.e., the number of elements), a large amount of data may need to be transferred to specify a configuration of the spatial-light modulator 200.

Therefore, to enable dynamic adjustment and/or setting of such a configuration (for example, during or between exposures), the write pattern may be compressed using a compression technique prior to transmission to the write device 100 (FIG. 1). In these embodiments, a compressed write pattern may be decoded or decompressed using decoding module 130 (FIG. 1) to produce the write pattern. Then, the configuration of the spatial-light modulator 200 may be adjusted based on the write pattern. Note that in some embodiments, the receiving of the compressed write pattern and the decoding occur concurrently, thereby enabling dynamic adjustment of the spatial-light modulator 200 during the maskless-lithography process.

In some embodiments, the write pattern includes a continuous-tone pattern and is compressed using a lossless compression technique. For example, the lossless compression technique may include a Joint Photographic Experts Group (JPEG) compression technique, such as JPEG-LS. In some embodiments, the compression technique may utilize Low Complexity Lossless Compression.

In some embodiments, the write pattern includes a binary pattern and/or a grayscale pattern that is compressed using a run-length encoding technique. (Note that a binary write pattern has long stretches of 0s and 1s.) An example of such an encoding technique is illustrated in FIG. 2B, which presents a block diagram illustrating a compressed write pattern 230 in accordance with an embodiment of the present invention. This compressed write pattern may include sequences of compressed data. A given sequence may correspond to a given linear array of pixels in the write pattern. Furthermore, the given sequence may include a first number of consecutive first type of pixels in the write pattern 240-1; a first grayscale value for a first transition pixel 242-1; a second number of consecutive second type of pixels in the write pattern 244; a second grayscale value for a second transition pixel 242-2; and a third number of consecutive first type of pixels in the write pattern 240-2. For example, the first type of pixels may correspond to a binary '1' in the write pattern and the second type of pixels may correspond to a binary '0' in the write pattern. Alternatively, the first type of pixels may correspond to a binary '0' in the write pattern and the second type of pixels may correspond to a binary '1' in the write pattern. Note that the linear array may correspond to a row and/or a column in the write pattern.

Note that in some embodiments the compressed write pattern 230 may include fewer or additional components, two or more components may be combined into a single component, and/or a position of one or more components may be changed.

As discussed previously, the write pattern may be determined based on differences between the target pattern and an estimate of the printed wafer pattern. In particular, in some embodiments a computer system determines a one-to-one correspondence between pixels in the write pattern and at least a subset of elements in a spatial-light modulator (such as the spatial-light modulator 200 in FIG. 2) used in the maskless-lithography process. Furthermore, the computer system generates the write pattern. In some embodiments, this calculation is based on a characteristic dimension of the elements in the spatial-light modulator. Note that the one-to-one correspondence may be determined simultaneously and/or concurrently with the write pattern.

Note that the write pattern may include features corresponding to at least the subset of the elements in the spatial-light modulator, and the settings of at least the subset of elements may result in the printing of a wafer pattern corresponding to these features. For example, these features may include one or more gates or line ends in an integrated circuit and/or may correspond to at least a subset of functionality in the integrated circuit. In an example embodiment, at least one of the features includes only one pixel and/or at least the subset includes only one element. Thus, in some embodiments a value for a given pixel in the write pattern may have a one-to-one correspondence with a setting of a mirror in the spatial-light modulator 200 (FIG. 2A). Note that in some embodiments the determining of the write pattern, as well as the determining of differences between the target pattern and the estimated pattern may be performed at sub-pixel resolution.

As discussed further below, in some embodiments the write pattern is determined, at least in part, using an iterative calculation. For example, an inverse calculation may be performed in which a desired or acceptable wafer pattern at an image plane of an optical system is used to determine the write beam (and thus, the write pattern) at an object plane. However, in some embodiments an image-based optical proximity correction is performed. Furthermore, in some embodiments the estimated wafer pattern is determined using a model of the lithographic process. This model may include a photo-resist model.

Furthermore, in some embodiments of the iterative calculation a gradient of a merit or error function (which is dependent upon or is a function of the difference between the target pattern and the estimated pattern, and thus is a dependent on the write pattern) may be determined. Note that the gradient may be calculated based on a formula obtained by taking the derivative of the merit function.

Figure 3:
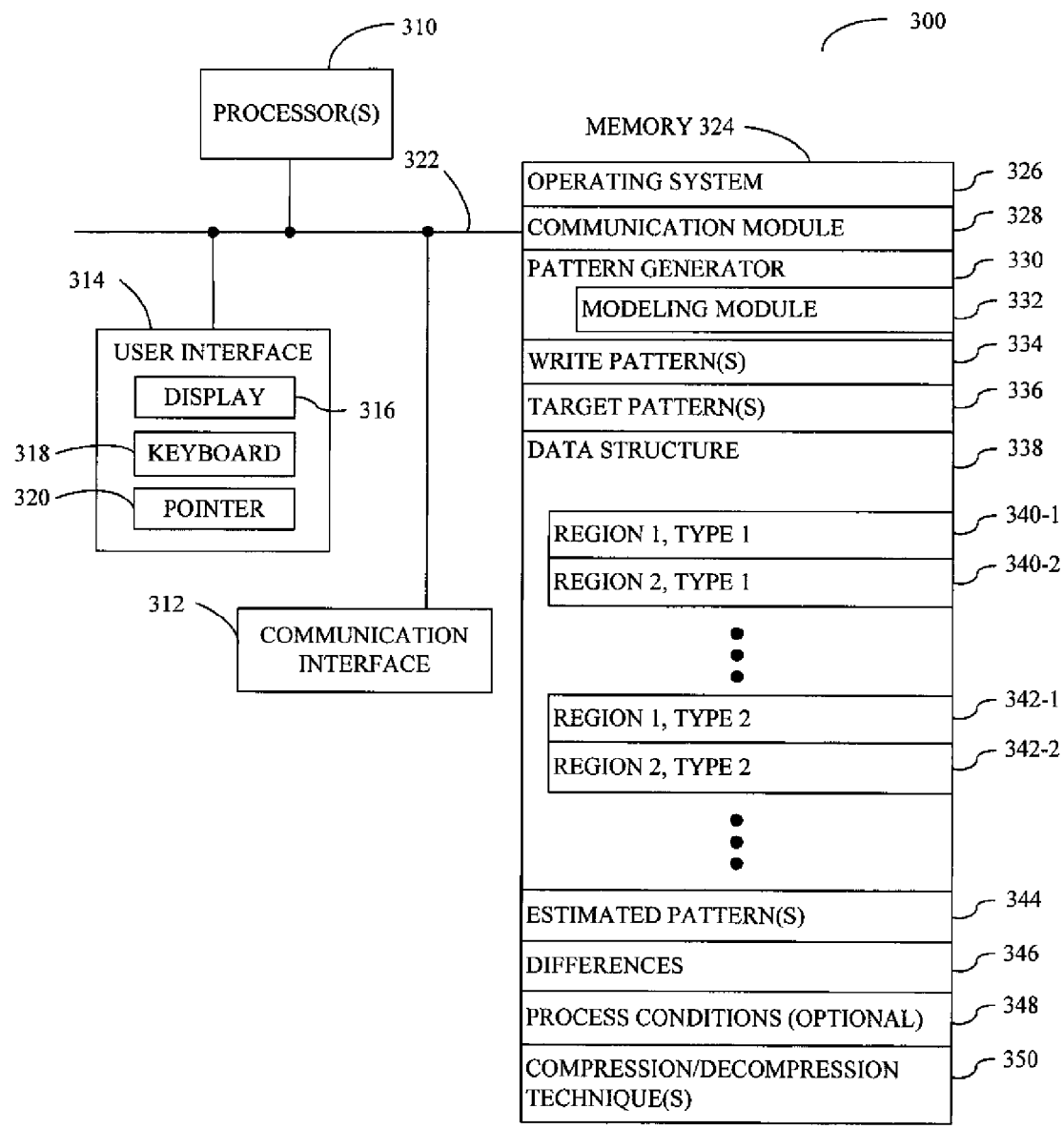
FIG. 3 is a block diagram illustrating a computer system in accordance with an embodiment of the present invention.

We now describe embodiments of the computer system. FIG. 3 presents a block diagram illustrating a computer system 300 in accordance with an embodiment of the present invention. Computer system 300 includes one or more processors 310, a communication interface 312, a user interface 314, and one or more signal lines 322 coupling these components together. Note that the one or more processing units 310 may support parallel processing and/or multi-threaded operation, the communication interface 312 may have a persistent communication connection, and the one or more signal lines 322 may constitute a communication bus. Moreover, the user interface 314 may include a display 316, a keyboard 318, and/or a pointer 320, such as a mouse.

Memory 324 in the computer system 300 may include volatile memory and/or non-volatile memory. More specifically, memory 324 may include ROM, RAM, EPROM, EEPROM, FLASH, one or more smart cards, one or more magnetic disc storage devices, and/or one or more optical storage devices. Memory 324 may store an operating system 326 that includes procedures (or a set of instructions) for handling various basic system services for performing hardware dependent tasks. The memory 324 may also store communications procedures (or a set of instructions) in a communication module 328. The communication procedures may be used for communicating with one or more computers, devices and/or servers, including computers, devices and/or servers that are remotely located with respect to the computer system 300.

Memory 324 may also include one or more program modules (or a set of instructions), including a pattern generator 330 (or a set of instructions) for determining write patterns 334 using a modeling module 332 (or a set of instructions) and target patterns 336. Pattern generator 330 may determine functions corresponding to write patterns 334. These functions may be stored in a data structure 338, and may include different types of features 340 and 342 at different positions in the write patterns 334.

Pattern generator 330 may also determine estimated patterns 344 and/or differences 346 between the estimated patterns 344 and the target patterns 336. In some embodiments, the modeling module 332 may use optional process conditions 348 to simulate a lithographic process. Furthermore, in some embodiments memory 324 includes one or more compression/decompression techniques 350 for encoding and/or decoding the write patterns 334.

Instructions in the various modules in the memory 324 may be implemented in a high-level procedural language, an object-oriented programming language, and/or in an assembly or machine language. The programming language may be compiled or interpreted, i.e., configurable or configured to be executed by the one or more processing units 310.

Although the computer system 300 is illustrated as having a number of discrete components, FIG. 3 is intended to be a functional description of the various features that may be present in the computer system 300 rather than as a structural schematic of the embodiments described herein. In practice, and as recognized by those of ordinary skill in the art, the functions of the computer system 300 may be distributed over a large number of servers or computers, with various groups of the servers or computers performing particular subsets of the functions. In some embodiments, some or all of the functionality of the computer system 300 may be implemented in one or more ASICs and/or one or more digital signal processors DSPs.

Computer system 300 may include fewer components or additional components, two or more components may be combined into a single component, and/or a position of one or more components may be changed. In some embodiments the functionality of computer system 300 may be implemented more in hardware and less in software, or less in hardware and more in software, as is known in the art.

We now described embodiments of the inverse calculation that may be used to determine one or more write patterns. This inverse calculation may be based on minimization of an error function (which is also sometimes referred to as a cost function or a Hamiltonian function). During each iteration of the calculation, the error function may be a function of the difference between the estimated pattern that results when an image associated with the write pattern is projected through the optical path of the write device (such as write device 100 in FIG. 1). In some embodiments, multiple images may be used, such as those corresponding to a range of process conditions.

A forward calculation may also be used when determining the error function. In the discussion that follows, coherent illumination by the illumination pattern 120 (FIG. 1) is assumed. Furthermore, the electric field falling upon the spatial-light modulator 116-2 (FIG. 1) is approximately constant. Note that some regions of the spatial-light modulator 116-2 in FIG. 1 (such as those corresponding to '0s' in the write pattern) reflect the light to the semiconductor wafer 126 (FIG. 1), while other regions (such as those corresponding to '1s' in the write pattern) do not reflect the light to the semiconductor wafer 126 (FIG. 1). It follows that a scalar electric field E after reflection off of the spatial-light modulator 116-2 (FIG. 1), may be expressed as $$E(\vec{r}) = \begin{Bmatrix} 0 \\ 1 \end{Bmatrix},$$

where $\vec{r}=(x, y)$ is a point on the (x,y) plane. (More generally, the electric field may included grayscale values in the range $\{-1, 1\}$ or arbitrary complex numbers that correspond to pixel values in the spatial-light modulator.) Note that this representation of the image pattern 122 (FIG. 1) may be re-expressed using a function $\phi$ (referred to as a level-set function) having positive regions that indicate light reflected to the semiconductor wafer 126 (FIG. 1) and negative regions that indicate an absence of light reflected to the semiconductor wafer 126 (FIG. 1). Furthermore, the level-set function may equal zero at the boundaries or contours in the configuration of the spatial-light modulator 116-2 (FIG. 1). Therefore, the electric field E associated with the spatial-light modulator 116-2 in FIG. 1 (and thus, the write pattern) may be re-expressed as a function of this level-set function, i.e., $$E(\vec{r}) = \hat{h}(\phi(x, y)),$$

where $\hat{h}$ is the a transmission or reflection function $$\hat{h}(x) = \begin{Bmatrix} 1 & x \geq 0 \\ 0 & x < 0 \end{Bmatrix}.$$

Since an ideal diffraction limited lens acts as a low-pass filter, this may be used as an approximation to the actual (almost but not quite perfect) optics 124 (FIG. 1) in the optical path. Mathematically, the action of a lens may be expressed as $$A(\vec{r}) = f^{-1}(\hat{C}(f(E(\vec{r}))))$$

where $A(\vec{r})$ indicates the electric field distribution on the wafer, $f$ indicates the Fourier transform, $f^{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{Bmatrix} 0 & k_x^2 + k_y^2 \geq k_{max}^2 \\ 1 & k_x^2 + k_y^2 < k_{max}^2 \end{Bmatrix},$$

wherein $k_x$, $k_y$ and $k_{max}$ represent frequency coordinates in Fourier space. Therefore, the intensity pattern on the wafer 126 (FIG. 1) is simply the square of the electric field $$I(\vec{r}) = |A(\vec{r})|^2.$$

Combining these two equations, we find $$f(\phi(x, y)) = (|f^{-1}(\hat{C}(f(\hat{h}(\phi(x, y)))))|^2).$$

This is a self-contained formula for the intensity pattern at the wafer 126 (FIG. 1).

Note that this is just one embodiment of the forward calculation that can be used within the scope of this invention, chosen by way of example due to its relative simplicity. More sophisticated forward models also fall within the scope of the present invention. Such models may take into account, by way of example but not limitation, various illumination conditions (e.g., off-axis, incoherent), the actual electromagnetics of the light field interacting with the spatial-light modulators 116 (FIG. 1), the polarization of the light field, the actual properties of the lens (such as aberrations), and/or the vector nature of the electromagnetic field as it propagates through the optical path in the write device 100 (FIG. 1).

Figure 4:
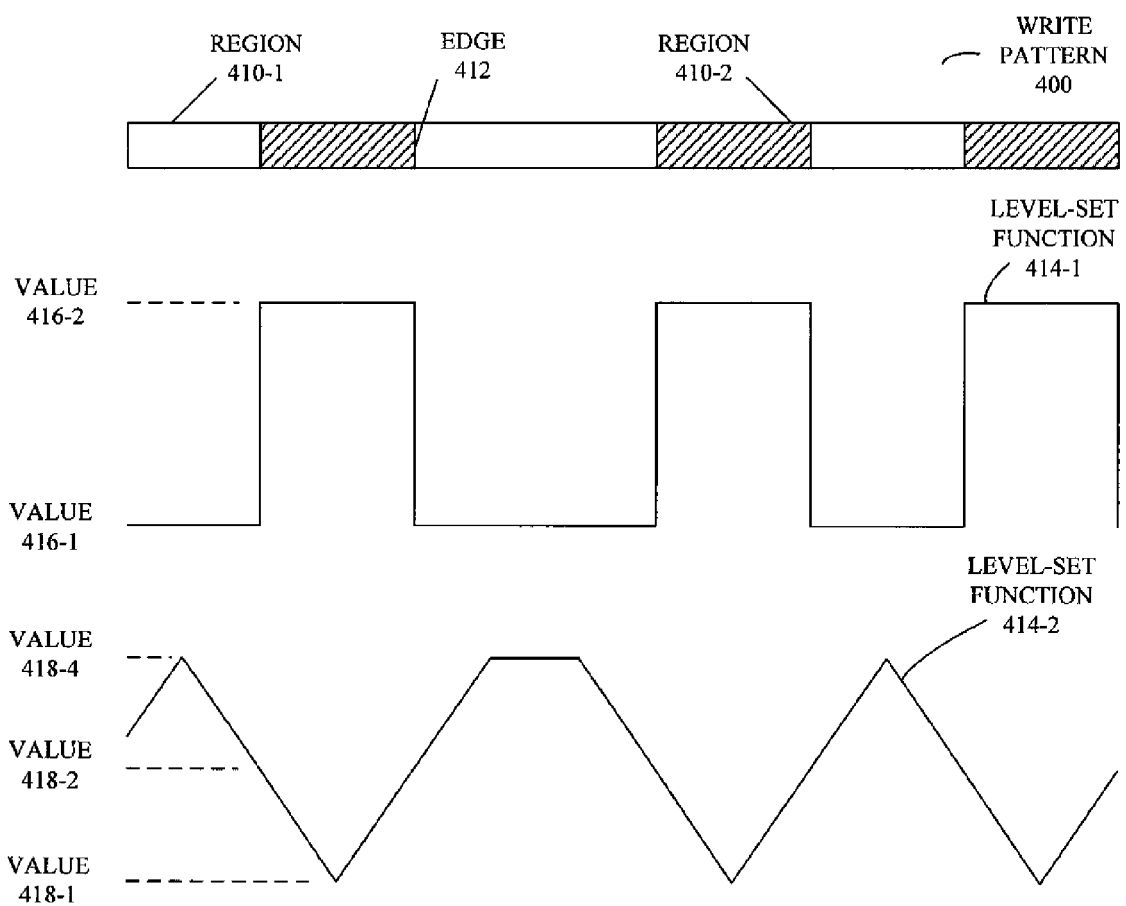
FIG. 4 is a block diagram illustrating a write pattern and corresponding level-set functions in accordance with an embodiment of the present invention.

We now describe the level-set functions in more detail. These functions may be used when determining a binary mask pattern. In the inverse calculation, the write pattern and/or the corresponding configuration of the spatial-light modulator 116-2 (FIG. 1) that is being determined may be represented as a function having a set of values that is larger than those in the final write pattern. As discussed previously, in one embodiment the function is a level-set function. This is illustrated in FIG. 4, which presents a write pattern 400 and corresponding level-set functions 414 in accordance with an embodiment of the present invention. The write pattern 400 includes alternating regions that direct light or (more generally) an illumination beam to the semiconductor wafer 126 in FIG. 1 (regions 410-1) or that do not direct light to the semiconductor wafer 126 in FIG. 1 (regions 410-2). Transitions from one region to another are characterized by a contour or an edge, such as edge 412. When viewed from a direction perpendicular to a plane of the spatial-light modulator 116-2 (FIG. 1), the edge 412 defines a contour that corresponds to the write pattern 400.

Level-set function 414-1 has two values 416. The edge 412 may correspond to a mid-point between these two values 416. In contrast, level-set function 414-2 has three values 418, and the edge 412 may correspond to value 418-2. While not illustrated in FIG. 4, the level-set functions 414 extend into the plane of FIG. 4 (i.e., they are 3-dimension functions). As is known to one of skill in the art, there are many alternate level-set functions and/or configurations that may be used. For example, in some embodiments one or more separate level-set functions and/or separate images may be used to represent the features in the write pattern 400.

As illustrated by level-set function 414-2, in some embodiments the level-set function may be expressed as a signed distance function relative to the contour or edge 412 (i.e., the value of the level-set function in at least a region is a function of the distance from the edge 412). This formulation may allow effects that occur nearer to the edge 412 to be highlighted.

In some embodiments, during each iteration of the inverse calculation the level-set function corresponding to the write pattern and/or the configuration of the spatial-light modulator 116-2 (FIG. 1) being modified is updated according to $$\phi_{i+1} = \phi_i + \Delta\phi = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the error function. Note that $\nabla(H)$ is $$\left. \frac{\delta H}{\delta \phi} \right|_{\phi_i},$$

i.e., it is the Frechet derivative of the error function H. Furthermore, in some embodiments $\nabla(H)$ is the direction of steepest descent for minimizing or optimizing H by changing $\phi$. Furthermore, in some embodiments a $1^{st}$ order and/or a $3^{rd}$ order Runge-Kutta method is used when updating $\phi_i$. In other embodiments, a Conjugate Gradient technique, a Levenberg- Marquardt technique, a Quasi-Newton technique, and/or a Simplex technique may be used.

At least some aspects of Simulated Annealing may be utilized in some embodiments of the inverse calculation. In particular, the error function H may be allowed to increase during some iterations as the calculation evolves. In this way, the global minimum in the multi-dimensional space may be determined. Note that the size of this multi-dimensional space is proportional to a number of quantization levels to the power of the number of pixels in the write pattern. In an example embodiment, these images have at least 1 million pixels (for example, 1024×1024).

Furthermore, in some embodiments, the inverse calculation is divided into a series of overlapping sub-problems (also referred to as work units) at least some of which are processed independently and/or concurrently. These work units may be based on features or structures (for example, repetitive structures) in the write pattern. Furthermore, in some embodiments the work units may partially overlap neighboring work units. For example, the work units may be between 10,000 nm$^2$ and 100 µm$^2$ in size.

In some embodiments, the inverse calculation is run for 100, 1000 or 10,000 iterations at which point the optimal solution has been determined. In other embodiments, the calculation is stopped based on convergence criteria, such as oscillatory behavior, a relative and/or absolute difference between the estimated wafer pattern and the target pattern, the latest change to the error function H, and/or the history of changes to the error function H. For example, the relative difference may be less than 1% and/or the absolute difference may be 10 nm for a critical dimension of 100 nm. Note that is some embodiments, the level-set function is re-distanced (i.e., restored to one having the distance function property relative to the edge 412) at intermediate iterations during the calculation.

We now describe embodiments of processes for determining and providing the write pattern. FIG. 5 presents a flow chart illustrating a process 500 for determining a write pattern in accordance with an embodiment of the present invention. During this process, a computer system determines a one-to-one correspondence between pixels in a write pattern and at least a subset of elements in a spatial-light modulator that is used in a maskless-lithography process (510). Furthermore, the computer system generates the write pattern (512). Note that the write pattern includes features corresponding to at least the subset of elements in the spatial-light modulator, and the write pattern is generated based on a characteristic dimension of an element in the spatial-light modulator and a target pattern that is to be printed on a semiconductor wafer during the maskless-lithography process.

FIG. 6 presents a flow chart illustrating a process 600 for providing an image pattern in accordance with an embodiment of the present invention. During this process, a write device adjusts a dynamic source to provide an illumination pattern (610). This dynamic source may be electronically configurable. Then, the write device configures a first spatial-light modulator to provide an image pattern by modifying the illumination pattern (612). This modification of the illumination pattern may be based on a write pattern that specifies settings of elements in the first spatial-light modulator for at least an exposure of at least a portion of a semiconductor wafer during the maskless-lithography process.

Figure 7:
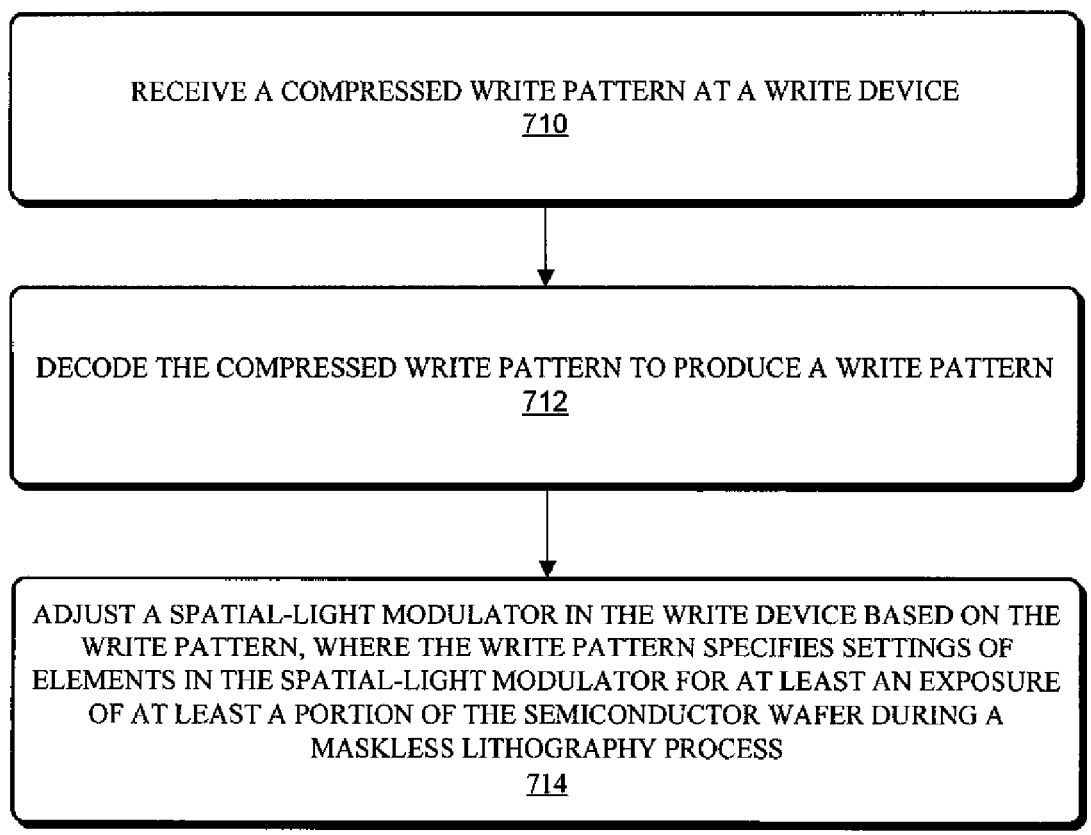
FIG. 7 is a flow chart illustrating a process for providing a write pattern in accordance with an embodiment of the present invention.

FIG. 7 presents a flow chart illustrating a process 700 for providing a write pattern in accordance with an embodiment of the present invention. During this process, a compressed write pattern is received by a write device (710). Then, the write device decodes the compressed write pattern to produce a write pattern (712). Next, the write device adjusts a spatial-light modulator in the write device based on the write pattern (714). Note that the write pattern specifies settings of elements in the spatial-light modulator for at least an exposure of at least a portion of the semiconductor wafer during a maskless-lithography process.

Note that in some embodiments of the process 500, the process 600, and/or the process 700 there may be additional or fewer operations, the order of the operations may be changed, and two or more operations may be combined into a single operation.

Figure 8:
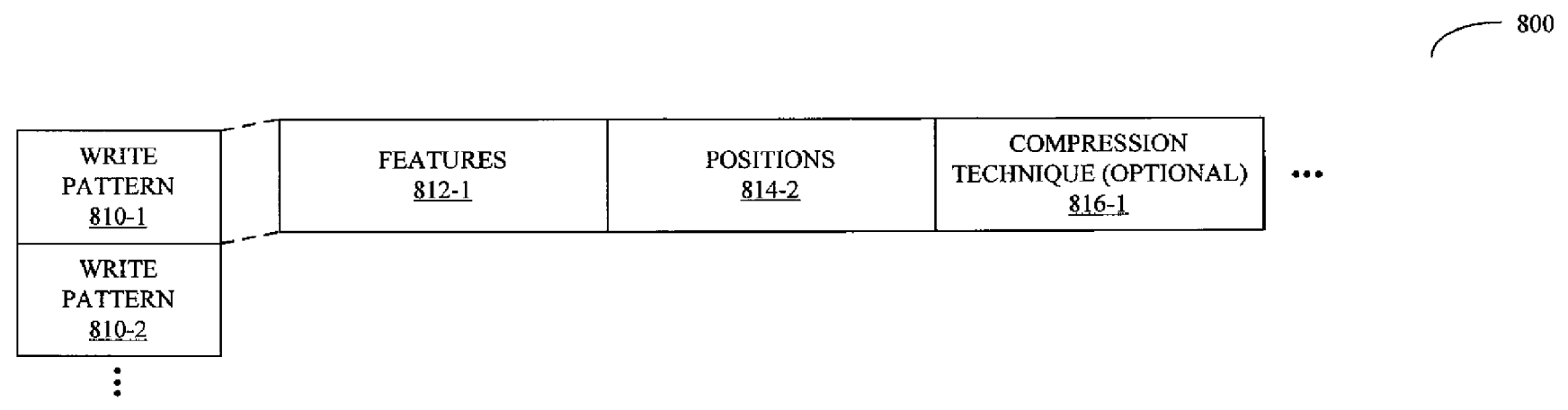

We now describe embodiments of a data structure that may be used in the computer system 300 (FIG. 3). FIG. 8 presents a block diagram illustrating a data structure 800 in accordance with an embodiment of the present invention. This data structure may include write patterns 810. For example, write pattern 810-1 may include one or more features 812-1 at one or more positions 814-1. Furthermore, the write patterns 810, such as the write pattern 810-1, may include information about an optional compression technique 816-1 that is used to compress at least a portion of the write pattern 810-1. Note that in some embodiments of the data structure 800 there may be fewer or additional components, two or more components may be combined into a single component, and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus to print a target pattern on a semiconductor wafer during a maskless-lithography process, comprising:
    a dynamic source configured to provide an illumination pattern, wherein the dynamic source is electronically configurable; and
    a first spatial-light modulator configured to modify the illumination pattern to produce an image pattern, wherein the modification of the illumination pattern is in accordance with a write pattern that specifies settings of elements in the first spatial-light modulator for at least an exposure of at least a portion of the semiconductor wafer during the maskless-lithography process;
    wherein the write pattern is compressed using a run-length encoding technique; and
    wherein, for at least one linear array of pixels in the write pattern, the run-length encoding technique provides at least one sequence including:
        a first number of consecutive first type of pixels in the write pattern;
        a first grayscale value for a first transition pixel;
        a second number of consecutive second type of pixels in the write pattern;
        a second grayscale value for a second transition pixel; and
        a third number of consecutive first type of pixels in the write pattern.

2. The apparatus of claim 1, wherein the dynamic source includes a second spatial-light modulator.

3. The apparatus of claim 1, wherein settings of the dynamic source and the first spatial-light modulator are selected based on the target pattern.

4. The apparatus of claim 1, wherein the target pattern includes a format that is compatible with GDSII or OASIS.

5. The apparatus of claim 1, wherein the dynamic source enables adjustment of the size of an aperture.

6. The apparatus of claim 1, wherein the dynamic source enables adjustment of the shape of an aperture.

7. The apparatus of claim 1, wherein the maskless-lithography process includes multiple exposures, and wherein the dynamic source is to be adjusted between at least two of the multiple exposures.

8. The apparatus of claim 1, wherein the elements in the first spatial-light modulator are arranged in a grid, and wherein the elements are mirrors.

9. The apparatus of claim 1, wherein the first spatial-light modulator is configured to modify a magnitude of the illumination pattern during the maskless-lithography process.

10. The apparatus of claim 1, wherein the first spatial-light modulator is configured to modify a phase of the illumination pattern during the maskless-lithography process.

11. The apparatus of claim 1, wherein the maskless-lithography process includes multiple exposures, and wherein the first spatial-light modulator is to be adjusted between at least two of the multiple exposures.

12. The apparatus of claim 1, wherein the write pattern includes a binary pattern.

13. The apparatus of claim 1, wherein the write pattern includes a continuous-tone pattern.

14. A method for providing an image pattern during a maskless-lithography process, comprising:
adjusting a dynamic source to provide an illumination pattern, wherein the dynamic source is electronically configurable; and
configuring a first spatial-light modulator to provide the image pattern by modifying the illumination pattern, wherein modification of the illumination pattern is in accordance with a write pattern that specifies settings of elements in the first spatial-light modulator for at least an exposure of at least a portion of a semiconductor wafer during the maskless-lithography process;
wherein the write pattern is compressed using a run-length encoding technique; and
wherein, for at least one linear array of pixels in the write pattern, the run-length encoding technique provides at least one sequence including:
a first number of consecutive first type of pixels in the write pattern;
a first grayscale value for a first transition pixel;
a second number of consecutive second type of pixels in the write pattern;
a second grayscale value for a second transition pixel; and
a third number of consecutive first type of pixels in the write pattern.

15. An apparatus to print a target pattern on a semiconductor wafer during a maskless-lithography process, comprising:
first means for providing an illumination pattern, wherein the first means includes a dynamic source; and
second means for modifying the illumination pattern, wherein the modification of the illumination pattern is in accordance with a write pattern that specifies settings of the second means for at least an exposure of at least a portion of the semiconductor wafer during the maskless-lithography process;
wherein the write pattern is compressed using a run-length encoding technique; and
wherein, for at least one linear array of pixels in the write pattern, the run-length encoding technique provides at least one sequence including:
a first number of consecutive first type of pixels in the write pattern;
a first grayscale value for a first transition pixel;
a second number of consecutive second type of pixels in the write pattern;
a second grayscale value for a second transition pixel; and
a third number of consecutive first type of pixels in the write pattern.

16. A method for providing a write pattern to a device that is to print a target pattern on a semiconductor wafer during a maskless-lithography process, comprising:
receiving a compressed write pattern at the device;
decoding the compressed write pattern to produce the write pattern; and
adjusting a spatial-light modulator in the device in accordance with the write pattern, wherein the write pattern specifies settings of elements in the spatial-light modulator for at least an exposure of at least a portion of the semiconductor wafer during the maskless-lithography process;
wherein the compressed write pattern is compressed using a run-length encoding technique; and
wherein, for at least one linear array of pixels in the write pattern, the run-length encoding technique provides at least one sequence including:
a first number of consecutive first type of pixels in the write pattern;
a first grayscale value for a first transition pixel;
a second number of consecutive second type of pixels in the write pattern;
a second grayscale value for a second transition pixel; and
a third number of consecutive first type of pixels in the write pattern.

17. The method of claim 16, wherein the target pattern includes a format that is compatible with GDSII or OASIS.

18. The method of claim 16, wherein the compressed write pattern is received by the device and the decoding occur concurrently, thereby enabling dynamic adjustment of the spatial-light modulator during the maskless-lithography process.

19. The method of claim 16, wherein the elements in the spatial-light modulator are arranged in a grid, and wherein the elements are mirrors.

20. The method of claim 16, wherein the spatial-light modulator modifies a magnitude of an illumination beam during the maskless-lithography process.

21. The method of claim 16, wherein the spatial-light modulator modifies a phase of an illumination beam during the maskless-lithography process.

22. The method of claim 16, wherein the maskless-lithography process includes multiple exposures, and wherein the spatial-light modulator is adjusted between at least two of the multiple exposures.

23. The method of claim 16, wherein the write pattern includes a binary pattern.

24. The method of claim 16, wherein the first type of pixels correspond to a binary '1' in the write pattern and the second type of pixels correspond to a binary '0' in the write pattern.

25. The method of claim 16, wherein the first type of pixels correspond to a binary '0' in the write pattern and the second type of pixels correspond to a binary '1' in the write pattern.

26. The method of claim 16, wherein the linear array corresponds to a row in the write pattern.

27. The method of claim 16, wherein the linear array corresponds to a column in the write pattern.

28. The method of claim 16, wherein the write pattern includes a continuous-tone pattern, and wherein the write pattern is compressed using a lossless compression technique.

29. The method of claim 28, wherein the lossless compression technique includes a Joint Photographic Experts Group (JPEG) compression technique.

30. An apparatus to print a target pattern on a semiconductor wafer during a maskless-lithography process, comprising a spatial-light modulator configured to modify an illumination beam, wherein the modification of the illumination beam is in accordance with a write pattern that specifies settings of elements in the spatial-light modulator for at least an exposure of at least a portion of the semiconductor wafer during the maskless-lithography process; and wherein the apparatus is configured to receive a compressed write pattern and to decode the compressed write pattern to produce the write pattern;

wherein the compressed write pattern is compressed using a run-length encoding technique; and wherein, for at least one linear array of pixels in the write pattern, the run-length encoding technique provides at least one sequence including:

a first number of consecutive first type of pixels in the write pattern;

a first grayscale value for a first transition pixel;

a second number of consecutive second type of pixels in the write pattern;

a second grayscale value for a second transition pixel; and a third number of consecutive first type of pixels in the write pattern.

31. The apparatus of claim 30, wherein the compressed write pattern is to be received and the decoding is to occur concurrently, thereby enabling dynamic adjustment of the spatial-light modulator during the maskless-lithography process.

32. An apparatus to print a target pattern on a semiconductor wafer during a maskless-lithography process, comprising a means for modifying an illumination beam, wherein the modification of the illumination beam is in accordance with a write pattern that specifies settings of the means for at least an exposure of at least a portion of the semiconductor wafer during the maskless-lithography process; and wherein the apparatus is configured to receive a compressed write pattern and to decode the compressed write pattern to produce the write pattern;

wherein the compressed write pattern is compressed using a run-length encoding technique; and wherein, for at least one linear array of pixels in the write pattern, the run-length encoding technique provides at least one sequence including:

a first number of consecutive first type of pixels in the write pattern;

a first grayscale value for a first transition pixel;

a second number of consecutive second type of pixels in the write pattern;

a second grayscale value for a second transition pixel; and a third number of consecutive first type of pixels in the write pattern.

33. A data structure stored in a non-transitory computer-readable memory, comprising a compressed write pattern corresponding to a write pattern, wherein the compressed write pattern specifies settings of elements in a spatial-light modulator for at least an exposure of at least a portion of the semiconductor wafer during a maskless-lithography process;

wherein the compressed write pattern is compressed using a run-length encoding technique; and wherein, for at least one linear array of pixels in the write pattern, the run-length encoding technique provides at least one sequence including:

a first number of consecutive first type of pixels in the write pattern;

a first grayscale value for a first transition pixel;

a second number of consecutive second type of pixels in the write pattern;

a second grayscale value for a second transition pixel; and a third number of consecutive first type of pixels in the write pattern.

* * * * *